(12) United States Patent
Onishi

(10) Patent No.: US 9,142,664 B2
(45) Date of Patent: Sep. 22, 2015

(54) SEMICONDUCTOR DEVICE

(71) Applicant: FUJI ELECTRIC CO., LTD., Kawasaki-shi (JP)

(72) Inventor: Yasuhiko Onishi, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/156,574

(22) Filed: Jan. 16, 2014

(65) Prior Publication Data

US 2014/0197477 A1    Jul. 17, 2014

(30) Foreign Application Priority Data

Jan. 16, 2013   (JP) ................. 2013-005812

(51) Int. Cl.
*H01L 29/66* (2006.01)
*H01L 29/78* (2006.01)

(52) U.S. Cl.
CPC ............................ *H01L 29/7811* (2013.01)

(58) Field of Classification Search
CPC ............. H01L 29/7802; H01L 29/7811
See application file for complete search history.

(56) References Cited

U.S. PATENT DOCUMENTS

| | | | |
|---|---|---|---|
| 5,216,275 A | 6/1993 | Chen | |
| 5,438,215 A | 8/1995 | Tihanyi | |
| 6,673,679 B1* | 1/2004 | Miyasaka et al. | 438/268 |
| 6,743,703 B2* | 6/2004 | Rodov et al. | 438/527 |
| 7,301,203 B2* | 11/2007 | Lee et al. | 257/339 |
| 2002/0074567 A1* | 6/2002 | Deboy et al. | 257/200 |
| 2002/0105024 A1 | 8/2002 | Fujihira | |
| 2003/0176031 A1 | 9/2003 | Onishi et al. | |
| 2005/0242411 A1* | 11/2005 | Tso | 257/480 |
| 2006/0033153 A1 | 2/2006 | Onishi et al. | 257/328 |
| 2007/0029597 A1* | 2/2007 | Lee et al. | 257/302 |
| 2008/0135926 A1* | 6/2008 | Ono et al. | 257/328 |
| 2008/0173935 A1* | 7/2008 | Miyajima | 257/328 |
| 2008/0185643 A1* | 8/2008 | Hossain | 257/342 |
| 2008/0237701 A1* | 10/2008 | Willmeroth et al. | 257/328 |
| 2008/0315299 A1* | 12/2008 | Saito et al. | 257/329 |
| 2009/0032851 A1* | 2/2009 | Pfirsch et al. | 257/288 |
| 2009/0159927 A1* | 6/2009 | Willmeroth et al. | 257/139 |

(Continued)

FOREIGN PATENT DOCUMENTS

| | | |
|---|---|---|
| JP | 09-266311 A | 10/1997 |
| JP | 2003-224273 A | 8/2003 |

(Continued)

*Primary Examiner* — Victor A Mandala
(74) *Attorney, Agent, or Firm* — Rossi, Kimms & McDowell LLP

(57) ABSTRACT

A superjunction semiconductor device is disclosed in which the tradeoff relationship between on-resistance and breakdown voltage is improved greatly so that reverse recovery capability is improved. A drain drift portion substantially corresponds to a portion just under p-base regions serving as an active region and forms a first parallel pn structure in which a first n-type region and a first p-type region are joined to each other alternately and repeatedly. A drain drift portion is surrounded by edge termination region including a second parallel pn structure. Edge termination region is formed such that second n-type and p-type regions oriented consecutively to the first parallel pn structure of the drain drift portion are joined to each other alternately and repeatedly. N-buffer layer is provided between first and second parallel pn structures and n+ drain layer. P-buffer layer is provided selectively inside n-buffer layer in edge termination region.

6 Claims, 13 Drawing Sheets

(56) References Cited

U.S. PATENT DOCUMENTS

| | | |
|---|---|---|
| 2009/0289276 A1 | 11/2009 | Yoshiura et al. |
| 2010/0163972 A1* | 7/2010 | Saggio et al. ................. 257/328 |
| 2010/0230715 A1* | 9/2010 | Mauder et al. ................ 257/139 |
| 2010/0264489 A1* | 10/2010 | Ohta et al. ................... 257/334 |
| 2011/0204442 A1* | 8/2011 | Guan et al. ................... 257/342 |
| 2012/0112306 A1* | 5/2012 | Onishi ......................... 257/487 |
| 2013/0181238 A1* | 7/2013 | Tischler et al. ................. 257/88 |
| 2014/0061644 A1* | 3/2014 | Cao et al. ....................... 257/48 |

FOREIGN PATENT DOCUMENTS

| | | |
|---|---|---|
| JP | 2004-022716 A | 1/2004 |
| JP | 4743447 B2 | 5/2011 |

* cited by examiner

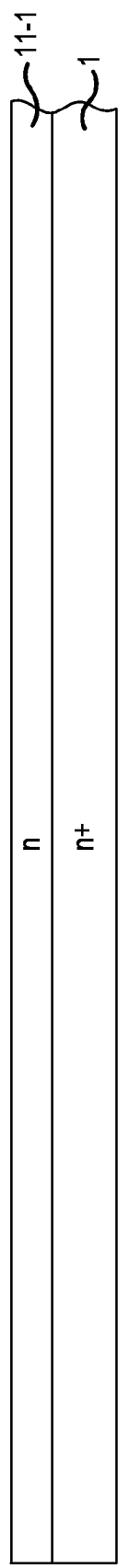
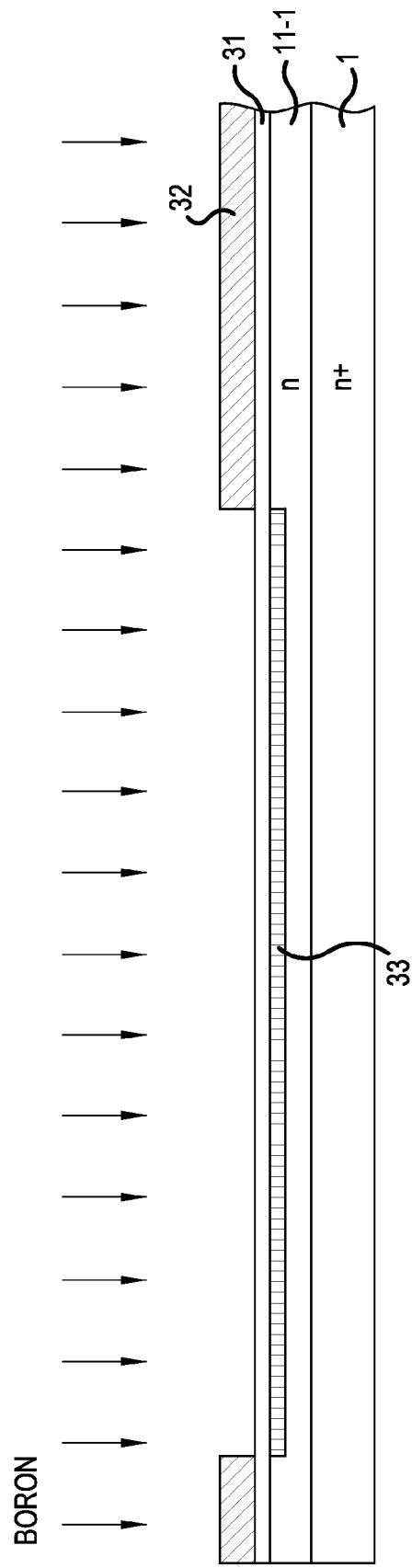

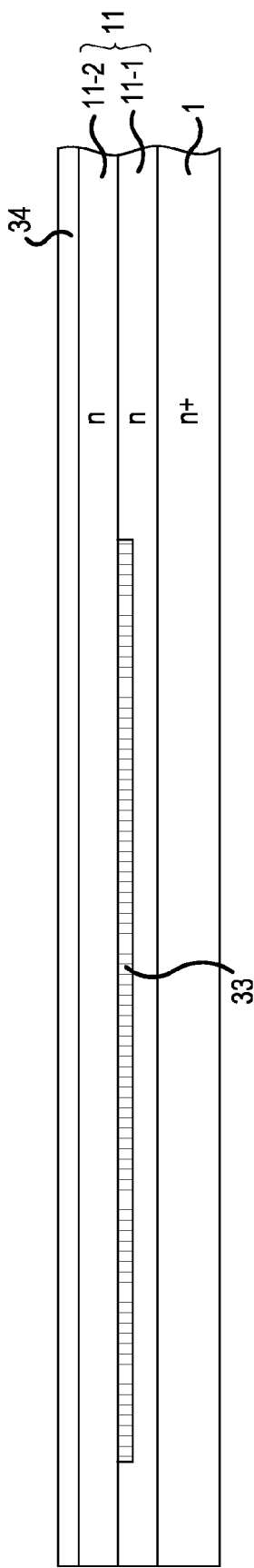
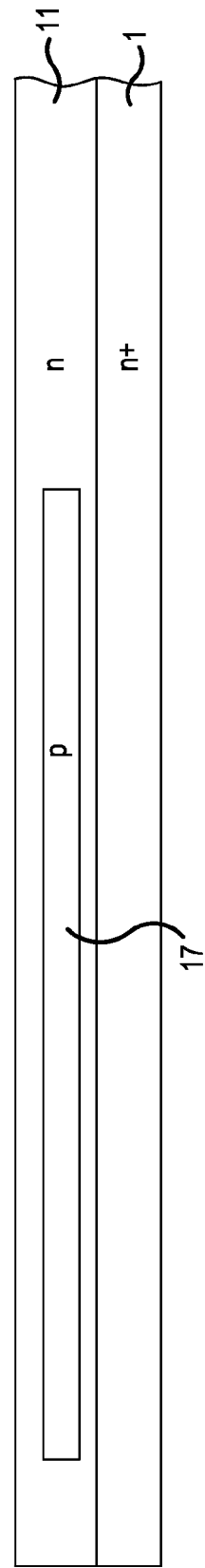
FIG.4
FIG.5

US 9,142,664 B2

SEMICONDUCTOR DEVICE

BACKGROUND OF THE INVENTION

A. Field of the Invention

This invention relates to a semiconductor device.

B. Description of the Related Art

Generally, semiconductor devices are classified into horizontal semiconductor devices having electrodes on one side and vertical semiconductor devices having electrodes on opposite sides. In a vertical semiconductor device, a direction in which a drift current flows in the ON state coincides with a direction in which a depletion layer spreads due to a reverse bias voltage in the OFF state. For example, in an n-channel vertical MOSFET (Metal Oxide Semiconductor Field Effect Transistor) with an ordinary planar gate structure, a high resistivity n⁻ drift layer portion operates as a region where a drift current flows vertically in the ON state. Accordingly, drift resistance is reduced when the current path of the n⁻ drift layer is shortened. It is therefore possible to obtain an effect that substantial on-resistance of the MOSFET can be reduced.

On the other hand, the high resistivity n⁻ drift layer portion is depleted in the OFF state to thereby increase breakdown voltage. Accordingly, as the n⁻ drift layer is thinner, the width with which a drain-to-base depletion layer spreads starting at a pn junction between a p-base region and the n⁻ drift layer is narrowed so that the breakdown voltage reaches the critical field strength of silicon more quickly. Thus, the breakdown voltage is lowered. On the contrary, in the semiconductor device with high breakdown voltage, the n⁻ drift layer is so thick that on-resistance becomes high enough increase the loss. In this manner, there is a tradeoff relationship between the on-resistance and the breakdown voltage.

It has been known that this tradeoff relationship is also established in semiconductor devices such as an IGBT (Insulated Gate Bipolar Transistor), a bipolar transistor and a diode. In addition, this tradeoff relationship is also common to horizontal semiconductor devices in each of which a direction where a drift current flows in the ON state is different from a direction where a depletion layer spreads due to a reverse bias voltage in the OFF state.

As a solution to the problem caused by the tradeoff relationship described above, there has been known a superjunction semiconductor device having a drift layer arranged into a parallel pn structure in which an n-type drift region and a p-type partition region are joined to each other alternately and repeatedly with an enhanced impurity concentration (for example, see U.S. Pat. No. 5,216,275, U.S. Pat. No. 5,438,215 and JP-A-9-266311). In the semiconductor device having such a structure, a depletion layer spreads horizontally from each pn junction extending in the vertical direction of the parallel pn structure to thereby deplete the whole of the drift layer in the OFF state in spite of the high impurity concentration of the parallel pn structure, so that the breakdown voltage can be increased.

On the other hand, in a semiconductor device provided with a diode or in a circuit using a parasitic body diode of a MOSFET etc. such as a bridge circuit, it is necessary to prevent the device from being broken down even when high di/dt occurs during reverse recovery of the diode. As a solution to such a problem, there has been proposed that the carrier lifetime of a parallel pn structure in an edge termination region is made shorter than the carrier lifetime of a parallel pn structure in an active region so that a current flowing into the active region from the edge termination region can be reduced to improve the reverse recovery capability (for example, JP-A-2003-224273, JP-A-2004-22716 and Japanese Patent No. 4743447). Japanese Patent No. 4743447 describes integration of a diode with a MOSFET, but has no suggestion about formation of a p-type region in a drain region opposite to an edge termination region of a MOSFET.

The configuration of a prior art superjunction MOSFET to which such a local lifetime technique is applied will be described. FIG. 18 is a cross sectional view showing the structure of a vertical MOSFET according to the prior art. FIG. 18 corresponds to FIG. 12 in JP-A-2004-22716. As shown in FIG. 18, drain drift portion 102 with a first parallel pn structure is provided on low resistivity n⁺ drain layer 101 with which drain electrode 113 on the back side makes ohmic contact. Each p-base region 103 having a high impurity concentration and serving as an active region 121 is provided selectively in the surface layer of drain drift portion 102.

Drain drift portion 102 substantially corresponds to a portion just under p-base regions 103 including a plurality of wells and serving as active region 121. Drain drift portion 102 has a first parallel pn structure in which a vertically layer-shape first n-type region 102a oriented in a thickness direction of a substrate and a vertically layer-shape first p-type region 102b oriented in the thickness direction of the substrate are joined to each other alternately and repeatedly along a surface of the substrate at a repeated pitch P101. An MOS gate structure (metal-oxide film-semiconductor insulating gate) including p-base regions 103, p⁺ contact regions 105, n⁺ source regions 106, gate insulating film 107 and gate electrode layer 108 and source electrode 110 are provided on the front side of the first parallel pn structure. Reference numeral 109 indicates an interlayer insulating film.

Drain drift portion 102 is surrounded by edge termination region 122 including a second parallel pn structure. Edge termination region 122 is provided consecutively to the first parallel pn structure of drain drift portion 102. In edge termination region 122, a vertically layer-shape second n-type region 112a oriented in the thickness direction of the substrate and a vertically layer-shape second p-type region 112b oriented in the thickness direction of the substrate are joined to each other alternately and repeatedly along the surface of the substrate at a repeated pitch P101. The repeated pitch P101 of the first parallel pn structure is substantially equal to that of the second parallel pn structure and the impurity concentration of the first parallel pn structure is substantially equal to that of the second parallel pn structure.

Oxide film 115 is provided on the surface of the second parallel pn structure. A field plate electrode FP extended from source electrode 110 is formed on oxide film 115 to thereby cover the part of the second parallel pn structure. N-type channel stopper region 114 connected to n⁺ drain layer 101 is formed on the outer side of edge termination region 122 and stopper electrode 116 makes ohmic contact with n-type channel stopper region 114. The second parallel pn structure and n-type channel stopper region 114 serve as a region (indicated as a hatched portion) shorter in carrier lifetime than the first parallel pn structure.

However, in JP-A-2003-224273, JP-A-2004-22716 and Japanese Patent No. 4743447, the carrier lifetime of the second parallel pn structure in edge termination region 122 is made shorter than that of the first parallel pn structure in active region 121 so that the quantity of stored carriers in edge termination region 122 can be reduced to suppress destruction by local crowding of a reverse recovery current during reverse recovery of a body diode including first p-type regions 102b and first n-type regions 102a. However, the leakage current in the OFF state increases due to the shortened carrier lifetime of the second parallel pn structure in edge termination region 122. As a result, there is a problem that the loss increases. In addition, when the leakage current increases excessively in the off state, there is a problem that the device breaks down due to thermal runaway.

The present invention is directed to overcoming or at least reducing the effects of one or more of the problems set forth above.

SUMMARY OF THE INVENTION

In order to solve the forgoing problems inherent in the prior art, the present invention provides a superjunction semiconductor device in which a tradeoff relationship between on-resistance and breakdown voltage can be remarkably improved so that reverse recovery capability in the semiconductor device can be improved.

In order to solve the forgoing problems, the semiconductor device according to the invention has the following characteristics. The semiconductor device has: an active region which is disposed on a first main surface side of a substrate to apply a current actively or passively; a first conductivity-type low-resistivity layer which is disposed on a second main surface side of the substrate; and a vertical drift portion which is disposed between the active region and the low-resistivity layer so that a drift current flows into the vertical drift portion vertically in the ON state while the vertical drift portion is depleted in the OFF state. The vertical drift portion forms a first parallel pn structure in which a first vertical first conductivity-type region oriented in a thickness direction of the substrate and a first vertical second conductivity-type region oriented in the thickness direction of the substrate are joined to each other alternately and repeatedly. The semiconductor device further has an edge termination region which is provided around the vertical drift portion and disposed between the first main surface and the low-resistivity layer. The edge termination region substantially serves as a region in which the current doesn't flow in the ON state while the edge termination region is depleted in the OFF state. A first conductivity-type layer with higher resistivity than the low-resistivity layer is provided between the first parallel pn structure and the low-resistivity layer so as to extend from the active region to the edge termination region. A second conductivity-type layer is provided selectively inside the first conductivity-type layer in the edge termination region.

In addition, the semiconductor device according to the invention has the aforementioned configuration of the invention, wherein: the second conductivity-type layer is provided to extend from an interface between the active region and the edge termination region to an outer periphery of the edge termination region.

In addition, the semiconductor device according to the invention has the aforementioned configuration of the invention, wherein: the edge termination region forms a second parallel pn structure in which a second vertical first conductivity-type region oriented in the thickness direction of the substrate and a second vertical second conductivity-type region oriented in the thickness direction of the substrate are joined to each other alternately and repeatedly; and the second conductivity-type layer is disposed at a distance from the second parallel pn structure.

In addition, the semiconductor device according to the invention has the aforementioned configuration of the invention, wherein: a depth of the second parallel pn structure from the first main surface is shallower than a depth of the first parallel pn structure from the first main surface; and the second conductivity-type layer is separated from the second parallel pn structure by a first conductivity-type region provided between the second parallel pn structure and the first conductivity-type layer.

According to the aforementioned configuration of the invention, a p-buffer layer (second conductivity-type layer) is provided selectively inside an n-buffer layer (first conductivity-type layer) in an edge termination region so that electrons injected into a second parallel pn structure from an n+ drain layer (low-resistivity layer) on the back side can be restrained. In accordance with this, holes injected into the second parallel pn structure from an outermost peripheral p-base region on the front side can be also restrained. Thus, the quantity of stored carriers in the edge termination region can be reduced so that current crowding in the outermost peripheral p-base region during reverse recovery of a parasitic body diode can be relaxed.

According to the semiconductor device according to the invention, an effect that reverse recovery capability can be improved can be obtained.

BRIEF DESCRIPTION OF THE DRAWINGS

The foregoing advantages and features of the invention will become apparent upon reference to the following detailed description and the accompanying drawings, of which:

FIG. 2 is a cross sectional view showing a state in which the semiconductor device according to Embodiment 1 is being fabricated;

FIG. 3 is a cross sectional view showing a state in which the semiconductor device according to Embodiment 1 is being fabricated;

FIG. 4 is a cross sectional view showing a state in which the semiconductor device according to Embodiment 1 is being fabricated;

FIG. 5 is a cross sectional view showing a state in which the semiconductor device according to Embodiment 1 is being fabricated;

DETAILED DESCRIPTION OF SPECIFIC EMBODIMENTS

Preferred embodiments of a semiconductor device according to this invention will be described below in detail with reference to the accompanying drawings. In the specification and the accompanying drawings, any layer or region with prefixed n or p means that electrons or holes are the majority carriers in that layer or region. In addition, suffixes "+" and "−" attached to n and p mean higher impurity concentration and lower impurity concentration than those of layers or regions without the suffixes "+" and "−". Incidentally, in the following description of the embodiments and the accompanying drawings, similar constituents will be referred to by the same signs correspondingly and redundant description thereof will be omitted.

Embodiment 1

Figure 1:
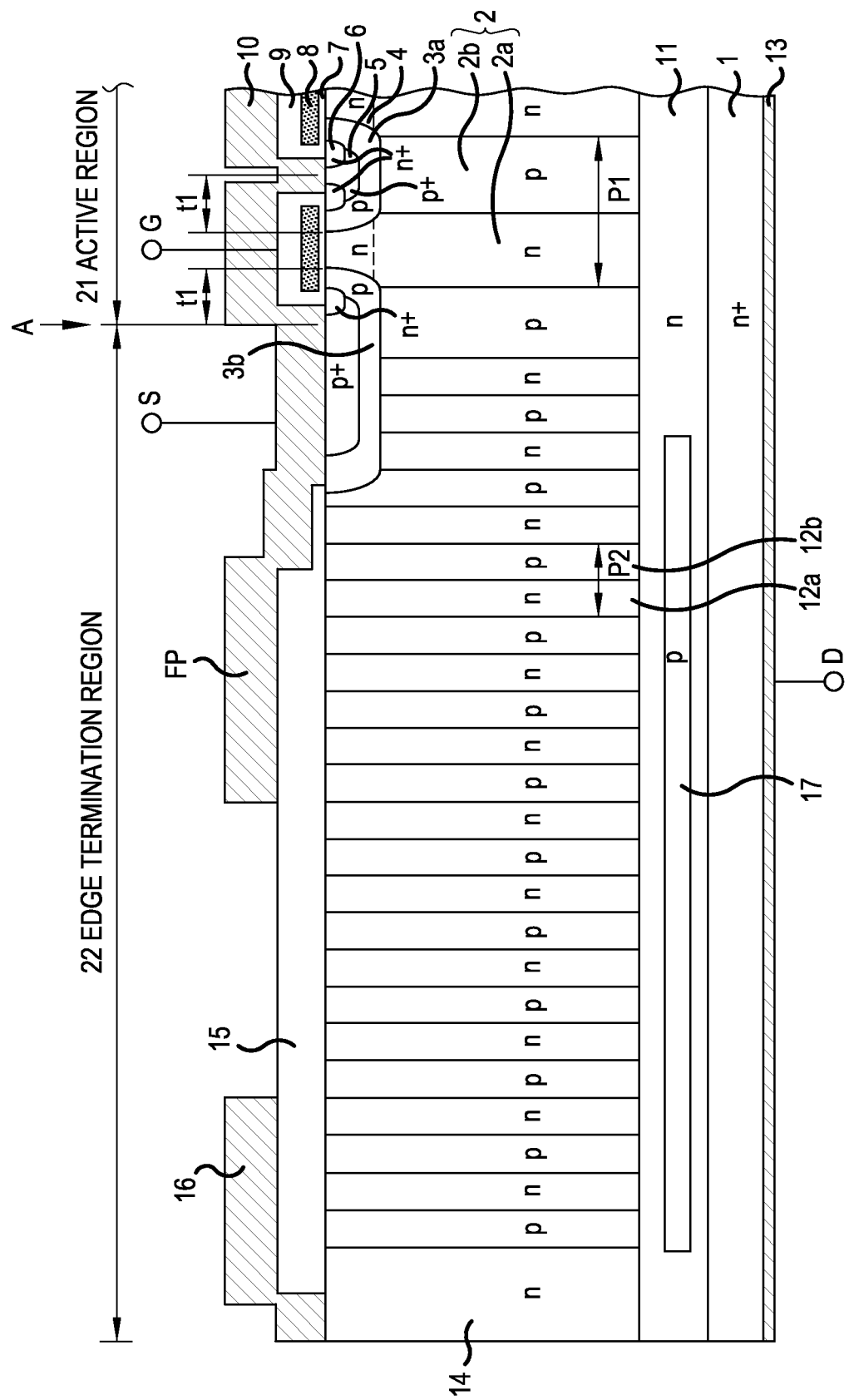
FIG. 1 is a cross sectional view of a semiconductor device according to Embodiment 1.

As for the structure of a semiconductor device according to Embodiment 1, an n-channel vertical MOSFET with a planar gate structure will be described by way of example. FIG. 1 is a cross sectional view of the semiconductor device according to Embodiment 1. The semiconductor device according to Embodiment 1 shown in FIG. 1 is a superjunction MOSFET which is formed so that n-buffer layer (first conductivity-type layer) 11 and drain drift portion (vertical drift portion) 2 with a first parallel pn structure are laminated sequentially on low resistivity $n^+$ drain layer (low-resistivity layer) 1 with which drain electrode 13 on the back side of a substrate makes ohmic contact. The substrate is an epitaxial substrate which will be described later.

P-base regions 3a with high impurity concentration serving as active region 21 are provided selectively on the front side (an opposite side to the n-buffer layer 11 side) surface layer of drain drift portion 2. $P^+$ contact region 5 with high impurity concentration and $n^+$ source regions 6 with high impurity concentration are selectively provided inside each p-base region 3a. $N^+$ source regions 6 are formed to be shallower than $p^+$ contact region 5 in well-like p-base region 3a so that a double diffusion type MOS portion is formed.

On the surface of a portion of each p-base region 3a located between drain drift portion 2 and $n^+$ source regions 6, gate electrode layer 8 made of polysilicon etc. is provided through gate oxide film 7. Source electrode 10 makes ohmic contact with p-base region 3a and $n^+$ source regions 6 through a contact hole opened in interlayer insulating film 9. In addition, a gate electrode wiring of a metal film makes ohmic contact on gate electrode layer 8 in a not-shown portion.

Drain drift portion 2 substantially corresponds to a portion just under a plurality of wells of p-base regions 3a serving as active region 21. Drain-drift portion 2 has a first parallel pn structure in which a vertically layer-shape first n-type region (first vertical first conductivity-type region) 2a oriented in a thickness direction of the substrate and a vertically layer-shape first p-type region (first vertical second conductivity-type region) 2b oriented in the thickness direction of the substrate are joined to each other alternately and repeatedly along a surface of the substrate at a repeated pitch P1.

An upper end (front side end portion) of any one of first n-type regions 2a reaches surface n-type drift region 4 which is a region interposed between adjacent ones of p-base regions 3a. A lower end (back side end portion) of first n-type region 2a contacts n-buffer layer 11. First n-type region 2a reaching front n-type drift region 4 serves as region where the current flow in the ON state. The remaining first n-type regions 2a substantially serve as regions where the current doesn't flow. In addition, an upper end of each of first p-type regions 2b contacts a well bottom of p-base region 3a. A lower end of first p-type region 2b contacts n-buffer layer 11.

Drain drift portion 2 is surrounded by edge termination region 22 including a second parallel pn structure. Edge termination region 22 is provided consecutively to the first parallel pn structure of drain drift portion 2. In edge termination region 22, a vertically layer-shape second n-type region (second vertical first conductivity-type region) 12a oriented in the thickness direction of the substrate and a vertically layer-shape second p-type region (second vertical second conductivity-type region) 12b oriented in the thickness direction of the substrate are joined to each other alternately and repeatedly along the surface of the substrate at a repeated pitch P2.

The second parallel pn structure is provided in order to easily increase of the breakdown voltage (in order to easily spread a drain-to-base depletion layer starting at the pn junction between p-base regions 3a, 3b and the $n^-$ drift layer in the OFF state). The impurity concentration of the second parallel pn structure is lower than the impurity concentration of the first parallel pn structure. The repeated pitch P2 of the second parallel pn structure is narrower than the repeated pitch P1 of the first parallel pn structure. Oxide film 15 is provided on the surface (front side surface) of the second parallel pn structure.

Oxide film 15 is formed to have a film thickness increasing stepwise from the drain drift portion 2 toward edge termination region 22. A field plate electrode FP extended from source electrode 10 is formed on oxide film 15 to cover the part of the second parallel pn structure. N-type channel stopper region 14 is formed on the outer side of edge termination region 22. Stopper electrode 16 makes ohmic contact with the front side of n-type channel stopper region 14.

N-buffer layer 11 is provided between the first, second parallel pn structures and $n^+$ drain layer 1 so as to restrain the drain-to-base depletion layer from reaching $n^+$ drain layer 1 in the OFF state. N-buffer layer 11 extends to an outer periphery (side surface) of edge termination region 22 so as to be connected to n-type channel stopper region 14. P-buffer layer (second conductivity-type layer) 17 is provided selectively inside n-buffer layer 11 in edge termination region 22. P-buffer layer 17 has a function of restraining electrons from being injected into the second parallel pn structure from $n^+$ drain layer 1 on the back side in the OFF state. P-buffer layer 17 does not come into contact with the second parallel pn structure and n drain layer 1.

In addition, it is preferable that an inner end portion of p-buffer layer 17 is extended up to an interface between active region 21 and edge termination region 22. The reason for that is because electrons injected into the second parallel pn structure from $n^+$ drain layer 1 in the vicinity of the back side which is opposite to the outermost peripheral p-base region 3b in high electric field through the second pn structure can be further reduced. The interface between active region 21 and edge termination region 22 is a position A which is located farther from the front side end portion of the inner side of the outermost peripheral p-base region 3b by width t1 which is half as long as the front side width of p-base region 3a. In addition, a distance between p-buffer layer 17 and the second parallel pn structure in the depth direction is a distance by which the depletion layer spreading to edge termination region 22 in the OFF state does not reach p-buffer layer 17.

Although not limited particularly, dimensions and impurity concentration of each portion take the following values when, for example, the superjunction MOSFET according to Embodiment 1 is for 600V-class. The thickness (depth direction) of drain drift portion 2 is 35.0 μm. The width of each of first n-type region 2a and first p-type region 2b is 7.0 μm (the repeated pitch P1 is 14.0 μm). The impurity concentration of each of first n-type region 2a and first p-type region 2b is $3.0 \times 10^{15}$ cm$^{-3}$. The thickness (depth direction) of the second parallel pn structure of edge termination region 22 is 35.0 μm. The width of each of second n-type region 12a and second p-type region 12b is 3.5 μm (the repeated pitch P2 is 7.0 μm). The impurity concentration of each of second n-type region 12a and second p-type region 12b is $1.0 \times 10^{15}$ cm$^{-3}$. The width of edge termination region 22 is 200 μm.

The diffusion depth of each of p-base regions 3a and 3b is 3.0 μm. The impurity concentration of the surface of p-base region 3a, 3b is $3.0 \times 10^{17}$ cm$^{-3}$. The diffusion depth of n$^+$ source region 6 is 0.2 μm. The impurity concentration of the surface of n$^+$ source region 6 is $3.0 \times 10^{20}$ cm$^{-3}$. The diffusion depth of p$^+$ contact region 5 is 0.6 μm. The impurity concentration of the surface of p$^+$ contact region 5 is $1.0 \times 10^{19}$ cm$^{-3}$. The diffusion depth of surface n-type drift region 4 is 2.5 μm. The impurity concentration of the surface of surface n-type drift region 4 is $2.0 \times 10^{16}$ cm$^{-3}$. The thickness of n$^+$ drain layer 1 is 300 μm. The impurity concentration of n$^+$ drain layer 1 is $1.0 \times 10^{19}$ cm$^{-3}$. The thickness of n-buffer layer 11 is 9 μm. The impurity concentration of n-buffer layer 11 is $1.0 \times 10^{15}$ cm$^{-3}$. The thickness of p-buffer layer 17 is 5 μm. The impurity concentration of p-buffer layer 17 is $3.0 \times 10^{15}$ cm$^{-3}$. The width of n-type channel stopper region 14 is 30.0 μm. The impurity concentration of n-type channel stopper region 14 is $6.0 \times 10^{15}$ cm$^{-3}$.

To speak accurately, the impurity concentration (impurity quantity) of each of the parallel pn structures mentioned above means the carrier concentration (carrier quantity). Generally, the impurity concentration and the carrier concentration are regarded as equivalent to each other in any region where activation has been performed thoroughly. Similarly, the impurity quantity and the carrier quantity are regarded as equivalent to each other in any region where activation has been performed thoroughly. Accordingly, in the specification, assume that the carrier concentration is included in the impurity concentration and the carrier quantity is included in the impurity quantity, for convenience's sake.

Next, the electric characteristic of the superjunction semiconductor device according to Embodiment 1 will be described. When a parasitic body diode including first p-type regions and first n-type regions is reversely recovered in the superjunction MOSFET (a voltage is applied to the parasitic body diode from a forward direction to a reverse direction in the state in which the gate and the source are short-circuited), normally, the first parallel pn structure is pinched off while stored carriers are discharged to the p-base regions and the n$^+$ drain layer. Therefore, the carriers are depleted in the active region during the reverse recovery of the parasitic body diode. On the other hand, the depletion layer spreads gradually in the edge termination region as the applied voltage increases. Thus, the carriers (stored carriers) remain in a neutral region. As the depletion layer spreads toward the outer side of the edge termination region, the stored carriers remaining in the neutral region are concentrated to flow into the outermost p-base region (hereinafter referred to outermost peripheral p-base region) in high electric field. Therefore, the reverse recovery capability is limited.

Figure 18:
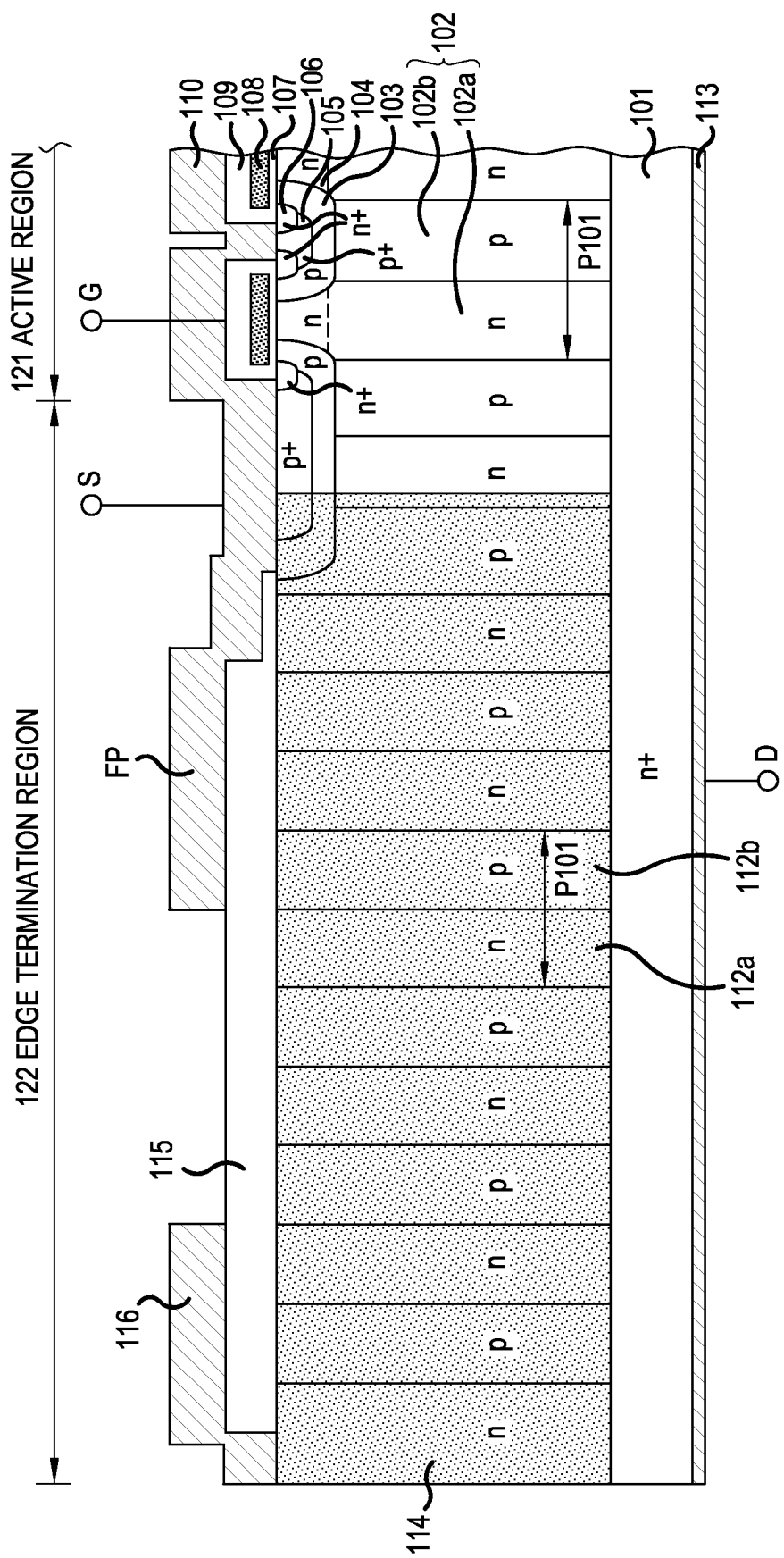
FIG. 18 is a cross sectional view of a vertical MOSFET according to the prior art.

The reason why the carriers are stored in the edge termination region is that electrons are injected into the second parallel pn structure from the n$^+$ drain layer on the back side with respect to holes (positive holes) injected into the second parallel pn structure from the outermost peripheral p-base region on the front side. Therefore, when the electrons can be restrained from being injected into the second parallel pn structure from the n$^+$ drain layer on the back side, the quantity of stored carriers in the edge termination region can be reduced so that current crowding in the outermost peripheral p-base region can be relaxed. For example, in the prior art superjunction MOSFET shown in FIG. 18, a local lifetime technique in which edge termination region 122 is irradiated with electron rays, helium (He), protons (H$^+$), etc. to introduce crystal defects which may serve as lifetime killers is applied to make the carrier lifetime of the second parallel pn structure in edge termination region 122 shorter than that of the first parallel pn structure in active region 121. Thus, recombination of the stored carriers can be accelerated to reduce the quantity of stored carriers in edge termination region 122.

On the other hand, in the superjunction MOSFET according to Embodiment 1, p-buffer layer 17 is provided selectively inside n-buffer layer 11 in edge termination region 22 so that a potential barrier generated by the pn junction between p-buffer layer 17 and n-buffer layer 11 can restrain electrons from being injected into the second parallel pn structure from n$^+$ drain layer 1 on the back side. Thus, the quantity of stored carriers in edge termination region 22 can be reduced. In addition, in the superjunction MOSFET according to Embodiment 1, the carrier lifetime of the second parallel pn structure in edge termination region 22 is made not shorter than the carrier lifetime of the first parallel pn structure in edge termination region 21. Accordingly, the leakage current in the OFF state can be reduced to lower the loss. Even when the total carrier lifetime of the first and second parallel pn structures is made short, the carrier lifetime of the second parallel pn structure in the edge termination region does not have to be made as short as in the prior art superjunction MOSFET in which the local lifetime technique is applied to shorten the carrier lifetime of the second parallel pn structure in the edge termination region. Accordingly, the leakage current in the OFF state can be restrained from increasing greatly.

Next, a method for manufacturing the superjunction semiconductor device according to Embodiment 1 will be described. FIGS. 2 to 6 are cross sectional views showing states in which the semiconductor device according to Embodiment 1 is being fabricated. First, as shown in FIG. 2, n epitaxial layer 11-1 which will serve as n-buffer layer 11 is grown on an n$^+$ semiconductor substrate which has, for example, about 300 μm thick and which will serve as n$^+$ drain layer 1. Next, as shown in FIG. 3, screen oxide (SiO$_2$) film 31 which has, for example. 250 Å thick is formed on n epitaxial layer 11-1. Next, resist mask 32 having an opening portion corresponding to a region where p-buffer layer 17 will be formed is formed on screen oxide film 31.

Next, from above screen oxide film 31, p-type impurities such as boron (B) are ion-injected into n epitaxial layer 11-1 exposed in the opening portion of resist mask 32. Thus, p-type impurity layer 33 which will serve as p-buffer layer 17 is formed selectively in a surface layer of n epitaxial layer 11-1. Next, as shown in FIG. 4, after resist mask 32 and screen oxide film 31 are removed, n epitaxial layer 11-2 is further grown on n epitaxial layer 11-1 to cover p-type impurity layer 33. In this manner, n-buffer layer 11 including n epitaxial layers 11-1 and 11-2 is formed. Next, screen oxide film 34 is formed on n-buffer layer 11.

Figure 6:
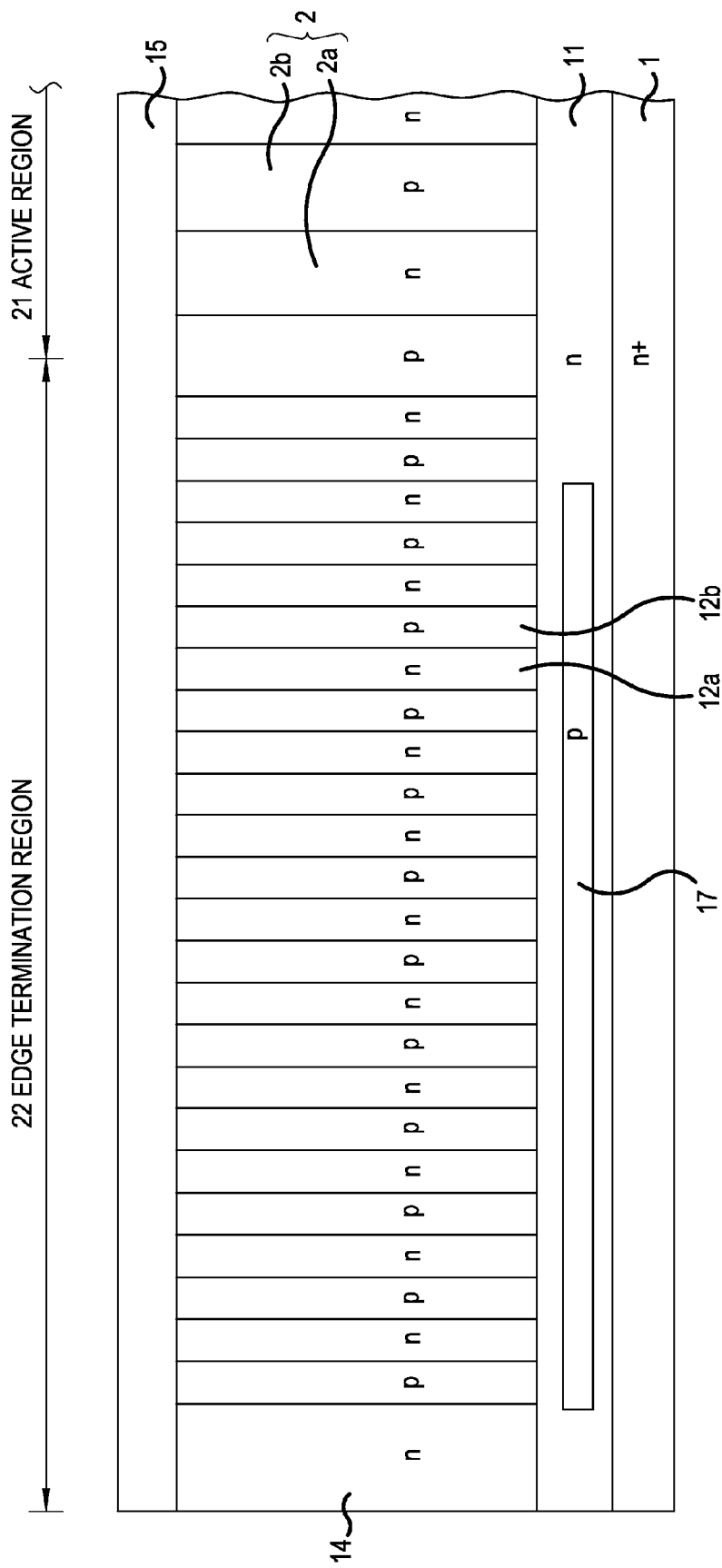
FIG. 6 is a cross sectional view showing a state in which the semiconductor device according to Embodiment 1 is being fabricated.

Next, as shown in FIG. 5, p-type impurity layer 33 is activated by thermal budget so that p-buffer layer 17 inside n-buffer layer 11 in edge termination region 22 is formed. Next, screen oxide film 34 is removed. Next, as shown in FIG. 6, first and second parallel pn structures and n channel stopper region 14 are formed on n-buffer layer 11 by a general multi epitaxial growth method. Specifically, first, an n epitaxial layer is grown on n-buffer layer 11. Next, a screen oxide film (not shown) is formed on, the n epitaxial layer and n-type impurities such as phosphorus (P) are ion-injected into the whole of the n epitaxial layer from above the screen oxide film.

Next, a resist mask (not shown) having an opening portion corresponding to a region where first, second p-type region 2b, 12b will be formed based on a repeated pitch P1, P2 of the first, second parallel pn structure is formed on the n epitaxial layer. Next, from above the screen oxide film, p-type impurities such as boron are ion-injected into the n epitaxial layer exposed in the opening portion of the resist mask so that a p-type impurity region is selectively formed inside the n epitaxial layer. After the steps from the step of growing an n epitaxial layer to the step of forming a p-type impurity region inside the n epitaxial layer are performed repeatedly a predetermined number of times (multi epitaxial process), an n epitaxial layer for sealing is further laminated in the topmost surface (cap deposition process).

Next, after oxide film 15 is formed on the n epitaxial layer for sealing, the respective p-type impurity regions formed inside the n epitaxial layers are activated by thermal budget. Due to the activation process, the p-type impurity regions opposite to each other in the depth direction between the n epitaxial layers laminated by the multi epitaxial process are connected to each other so that first and second p-type regions 2b and 12b are formed. In addition, the n epitaxial layers remaining between first and second p-type regions 2b and 12b serve as first and second n-type regions 2a and 12a. In this manner, the first and second parallel pn structures are formed.

An epitaxial substrate in which n-buffer layer 11 is laminated on the n⁺ semiconductor substrate serving as n⁺ drain layer 1 and the first and second parallel pn structures and n-type channel stopper region 14 are laminated on n-buffer layer 11 is fabricated by the steps performed so far. Then, an MOS gate structure and a front side electrode (source electrode 10, etc.) in active region 21 are formed on the front side (first and second parallel pn structure side) of the epitaxial substrate and a back side electrode (drain electrode 13) is formed on the back side (n⁺ drain layer 1 side) of the epitaxial substrate. Thus, a superjunction MOSFET shown in FIG. 1 is completed.

As described above, according to Embodiment 1, the p-buffer layer is provided selectively inside the n-buffer layer in the edge termination region so that electrons can be restrained from being injected into the second parallel pn structure from the n⁺ drain layer on the substrate back side. In accordance with this, holes can be restrained from being injected into the second parallel pn structure from the outermost peripheral p-base region on the front side. Thus, the quantity of stored carrier in the edge termination region can be reduced so that current crowding in the outermost peripheral p-base region during the reverse recovery of the parasitic body diode can be relaxed. Accordingly, reverse recovery withstanding capacity (breakdown resistance) can be improved. Moreover, the carrier lifetime of the second parallel pn structure in the edge termination region does not have to be made shorter than the carrier lifetime of the first parallel pn structure in the active region unlike in the prior art. Accordingly, the leakage current in the OFF state can be reduced to lower the loss in comparison with the prior art.

Embodiment 2

Figure 7:
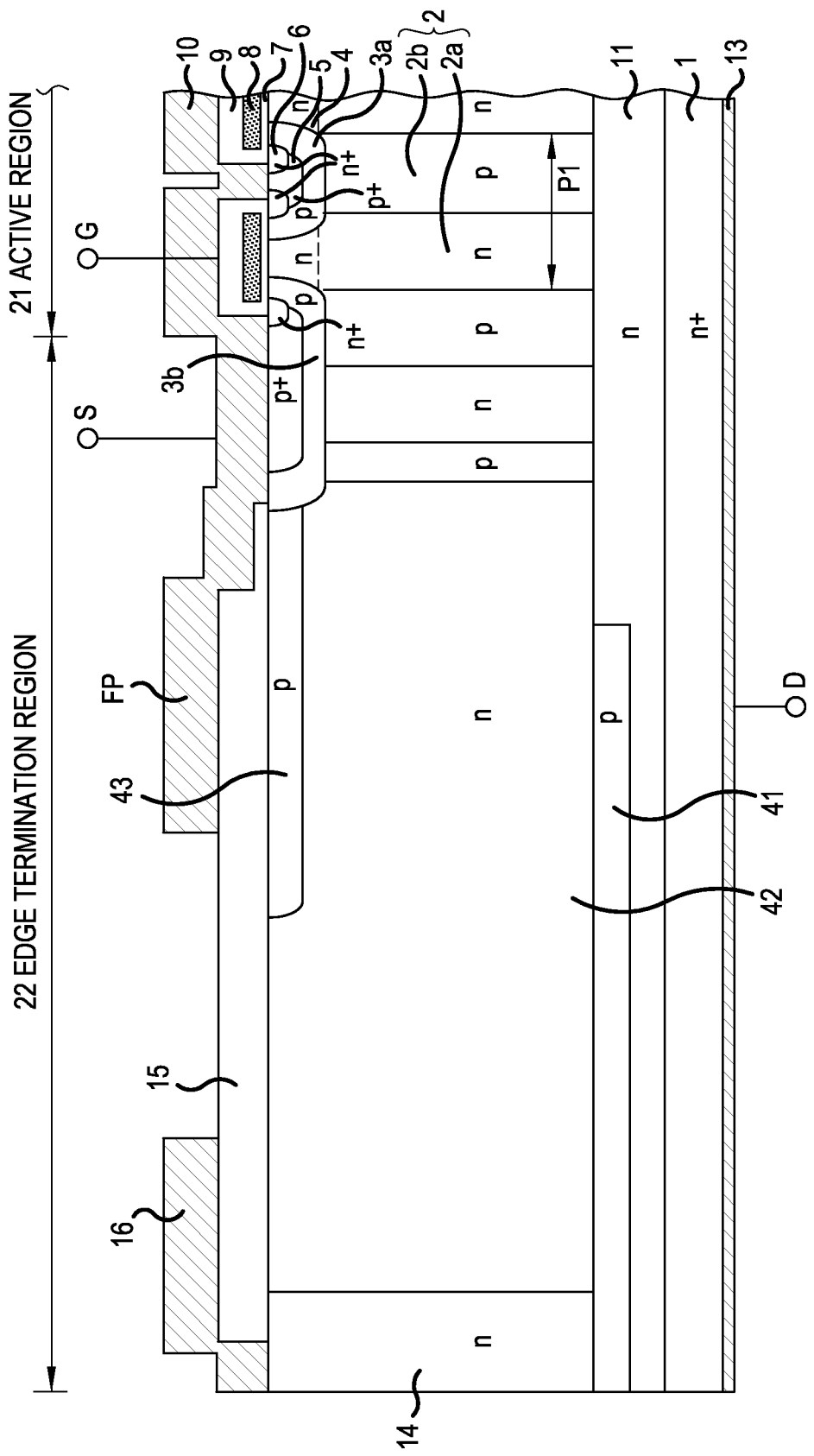
FIG. 7 is a cross sectional view of a semiconductor device according to Embodiment 2.

The structure of a superjunction semiconductor device according to Embodiment 2 will be described. FIG. 7 is a cross sectional view showing the structure of the semiconductor device according to Embodiment 2. The superjunction semiconductor device according to Embodiment 2 is different from the superjunction semiconductor device according to Embodiment 1 in the following two points. The first different point is that n-type bulk region 42 consecutive to the first parallel pn structure is provided in place of the second parallel pn structure and p-type RESURF region 43 is provided in a front side surface layer of n-type bulk region 42. The second different point is that an outer end portion of p-buffer layer 41 is extended up to the outer periphery (side surface) of edge termination region 22.

N-type bulk region 42 is a region between the first parallel pn structure provided to extend from active region 21 to edge termination region 22, and n-type channel stopper region 14 provided on the outermost side of edge termination region 22. P-type RESURF region 43 is provided selectively in the front side surface layer of n-type bulk region 42 so as to come into contact with the outermost peripheral p-base region 3b. Oxide film 15 is provided on the surfaces (front side surfaces) of n-type bulk region 42 and p-type RESURF region 43. P-buffer layer 41 is provided inside n-buffer layer 11 to extend, for example, from an interface between active region 21 and edge termination region 22 to the outer periphery of edge termination region 22. P-buffer layer 41 may come into contact with n-type bulk region 42 and n-type channel stopper region 14. The configuration of the superjunction semiconductor device according to Embodiment 2 except the first and second different points is the same as that of the superjunction semiconductor device according to Embodiment 1.

Figure 8:
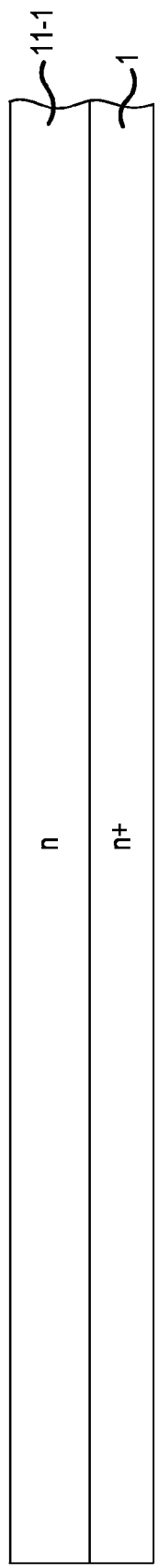
FIG. 8 is a cross sectional view showing a state in which the semiconductor device according to Embodiment 2 is being fabricated.
Figure 9:
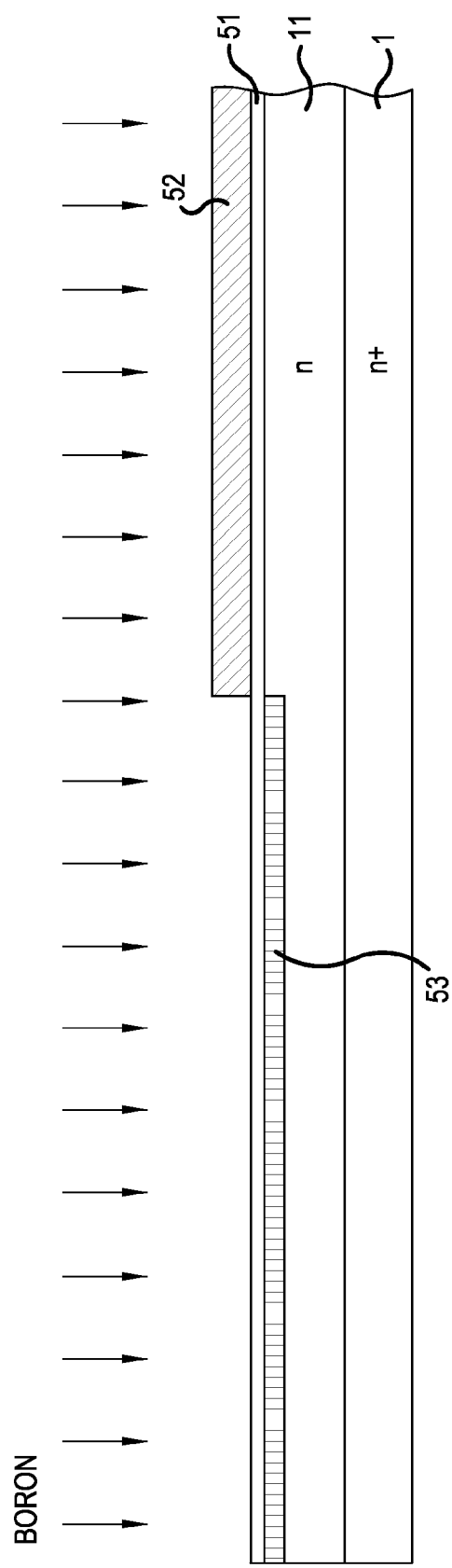
FIG. 9 is a cross sectional view showing a state in which the semiconductor device according to Embodiment 2 is being fabricated.

Next, a method of manufacturing the superjunction semiconductor device according to Embodiment 2 will be described. FIGS. 8 to 11 are cross sectional views showing states in which the semiconductor device according to Embodiment 2 is being fabricated. First, as shown in FIG. 8, n-buffer layer 11 is epitaxially grown on the n⁺ semiconductor substrate which has, for example, about 300 um thick and which will serve as n⁺ drain layer 1. Next, as shown in FIG. 9, screen oxide film 51 which is, for example, 250 Å thick is formed on n-buffer layer 11. Next, resist mask 52 having an opening portion corresponding to a region where p-buffer layer 41 will be formed is formed on screen oxide film 51.

Figure 10:
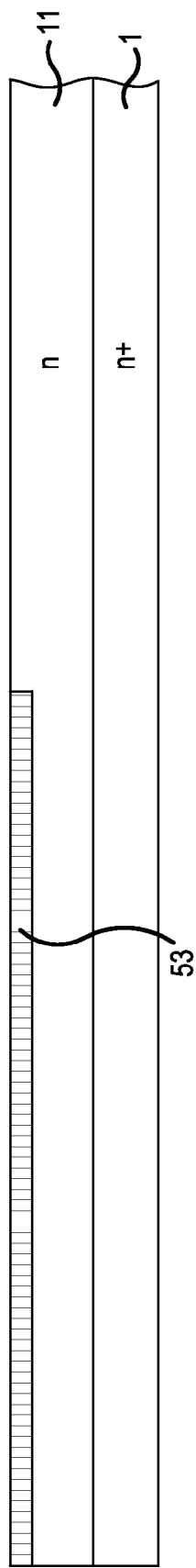
FIG. 10 is a cross sectional view showing a state in which the semiconductor device according to Embodiment 2 is being fabricated.
Figure 11:
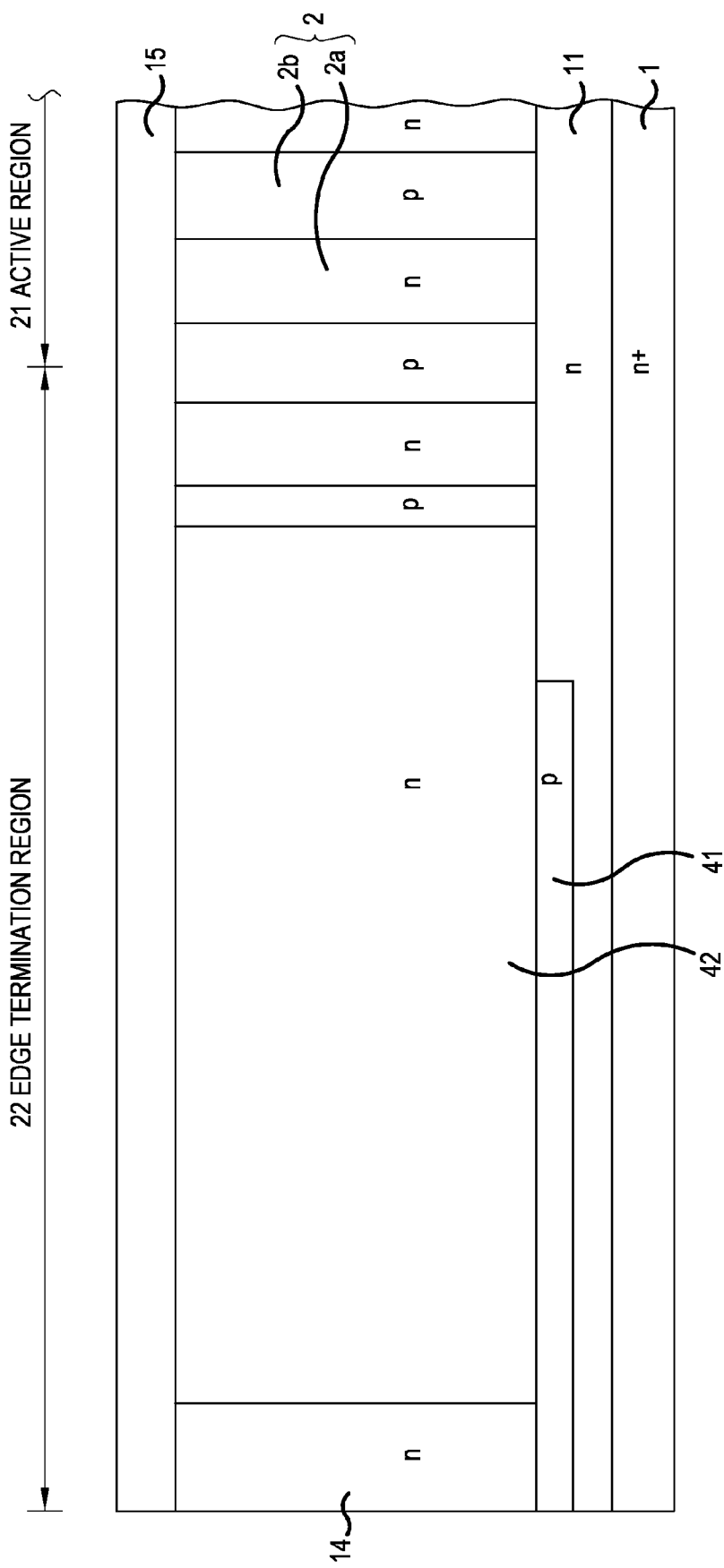
FIG. 11 is a cross sectional view showing a state in which the semiconductor device according to Embodiment 2 is being fabricated.

Next, from above screen oxide film 51, p-type impurities such as boron are ion-injected into n-buffer layer 11 exposed in the opening portion of resist mask 52. Thus, p-type impurity layer 53 which will serve as p-buffer layer 41 is formed selectively in a surface layer of n-buffer layer 11. Next, as shown in FIG. 10, resist mask 52 and screen oxide film 51 are removed. Next, as shown in FIG. 11, the first parallel pn structure, n-type bulk region 42 and n-type channel stopper region 14 are formed on n-buffer layer 11 by a general multi epitaxial growth method, in the same manner as in Embodiment 1.

In this multi epitaxial process, patterning may be performed so that portions where p-type regions should not be formed (i.e. regions which will serve as first n-type regions 2a, n-type bulk region 42, and n-type channel stopper region 14) can be covered with a resist mask. P-type impurity layer 53 inside n-buffer layer 11 is activated, for example, by thermal budget for activating the first parallel pn structure formed by the multi epitaxial process so that p-type impurity layer 53 can serve as p-buffer layer 41. The thermal budget for forming p-buffer layer 41 may be performed prior to the multi epitaxial process. A MOS gate structure and a front side electrode in active region 21, and p-type RESURF region 43 and a back side electrode in edge termination region 22 are then formed by a general method. Thus, a superjunction MOSFET shown in FIG. 7 is completed.

As described above, according to Embodiment 2, a similar effect to that of Embodiment 1 can be obtained as long as the p-buffer layer is provided in a part of the n-buffer layer even in the configuration in which the edge termination region is constituted by the n-type region. In addition, according to Embodiment 2, when the p-buffer layer is provided to extend from an interface between the active region and the edge termination region to an outer periphery of the edge termination region, electrons injected into a second parallel pn structure from the n$^+$ drain layer on the back side of the substrate can be reduced greatly to lower the quantity of stored carriers, in comparison with the case where the p-buffer layer is provided partially inside the n-buffer layer in the edge termination region.

Embodiment 3

Figure 12:
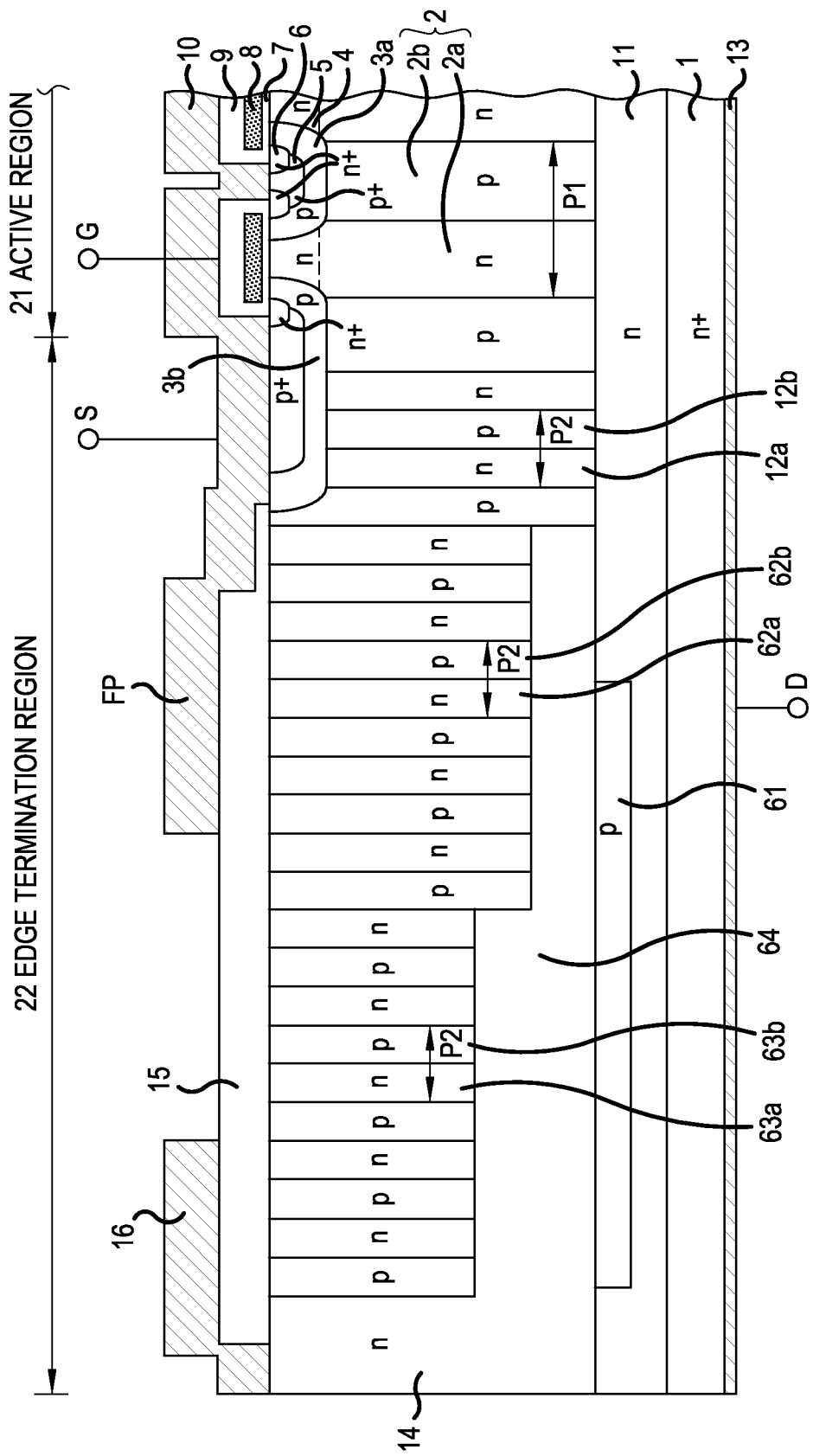
FIG. 12 is a cross sectional view of a semiconductor device according to Embodiment 3.

The structure of a superjunction semiconductor device according to Embodiment 3 will be described. FIG. 12 is a cross sectional view showing the structure of the semiconductor device according to Embodiment 3. The superjunction semiconductor device according to Embodiment 3 is different from the superjunction semiconductor device according to Embodiment 1 in the following two points. The first different point is that the depth of a parallel pn structure in device peripheral portion 22 becomes shallower as it goes toward the outer periphery. The second different point is that the parallel pn structure in edge termination region 22 is separated from the p-buffer layer by n-type region (first conductivity-type region) 64 formed in a region where the parallel pn structure in edge termination region 22 becomes shallower.

A third parallel pn structure is provided in edge termination region 22 so as to be consecutive to the second parallel pn structure and outside the second parallel pn structure. The third parallel pn structure is formed so that a vertically layer-shape third n-type region 62a oriented in the thickness direction of a substrate and a vertically layer-shape third p-type region 62b oriented in the thickness direction of the substrate are joined to each other alternately and repeatedly along a surface of the substrate at a repeated pitch P2. The depth of the third parallel pn structure from the front surface is shallower than that of the second parallel pn structure from the front surface. The depth of the second parallel pn structure from the front surface may be shallower than that of the first parallel pn structure from the front surface.

Further, a fourth parallel pn structure is provided consecutively to the third parallel pn structure and outside the third parallel pn structure. The fourth parallel pn structure is formed so that a vertically layer-shape fourth n-type region 63a oriented in the thickness direction of the substrate and a vertically layer-shape fourth p-type region 63b oriented in the thickness direction of the substrate are joined to each other alternately and repeatedly along the surface of the substrate at a repeated pitch P2. The depth of the fourth parallel pn structure from the substrate front surface is shallower than that of the third parallel pn structure from the front surface. The repeated pitches P2 in the second to fourth parallel pn structures are substantially equal to one another.

Third and fourth p-type regions 62b and 63b of the parallel pn structures in edge termination region 22 are separated from p-buffer layer 61 by n-type region (first conductivity-type region) 64 formed in a region where the third and fourth parallel pn structures in edge termination region 22 become shallower. When second, third and fourth p-type regions 12b, 62b and 63b of the second, third and fourth parallel pn structures are separated from p-buffer layer 61 by n-type region 64, the influence of p-buffer layer 61 on the depletion layer can be prevented. Therefore, even when p-buffer layer 61 is provided inside n-buffer layer 11, the spreading of the depletion layer is not restrained by p-buffer layer 61. Accordingly, the increase of the breakdown voltage can be ensured easily. P-buffer layer 61 may be separated from second, third and fourth p-type regions 12b, 62b and 63b of the second, third and fourth parallel pn structures or may be provided in an interface between n-type region 64 and n-buffer layer 11. The structure of the superjunction semiconductor device according to Embodiment 3 except the first and second different points is the same as that of the superjunction semiconductor device according to Embodiment 1.

Figure 13:
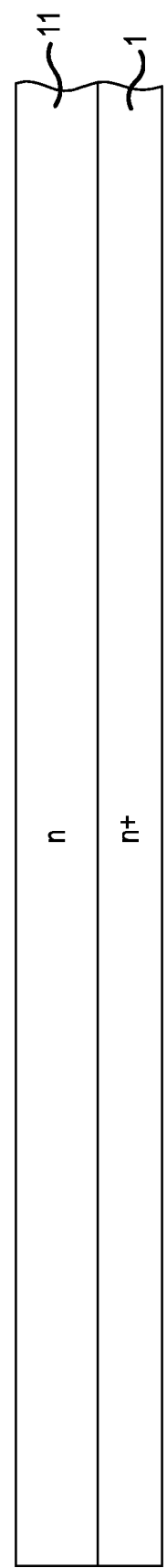
FIG. 13 is a cross sectional view showing a state in which the semiconductor device according to Embodiment 3 is being fabricated.
Figure 14:
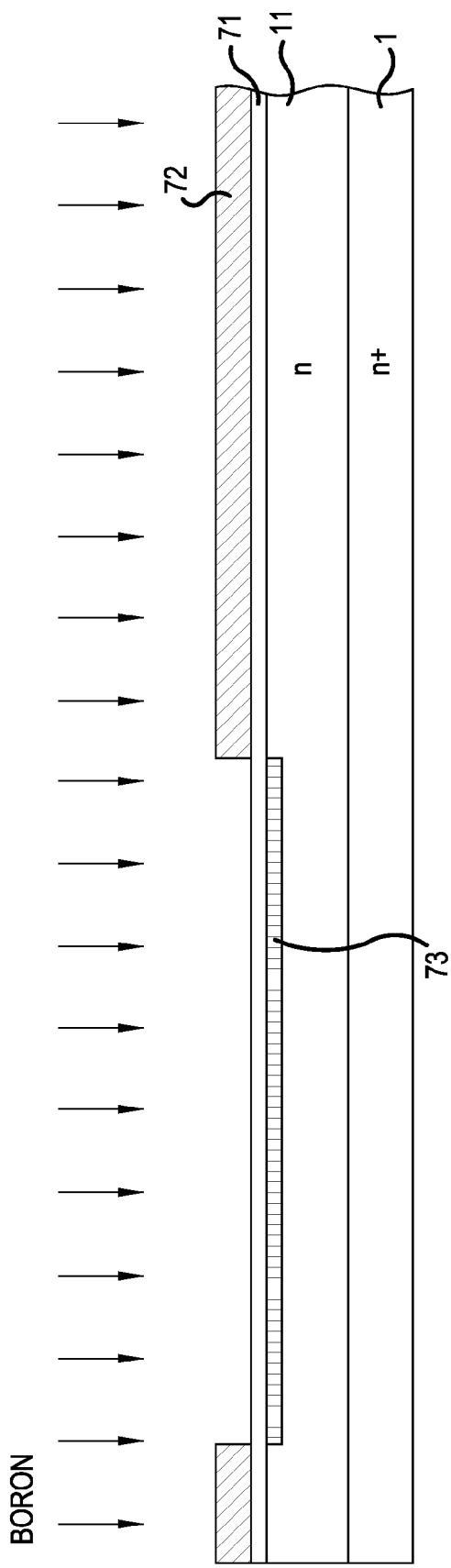
FIG. 14 is a cross sectional view showing a state in which the semiconductor device according to Embodiment 3 is being fabricated.

Next, a method for manufacturing the superjunction semiconductor device according to Embodiment 3 will be described. FIGS. 13 to 16 are cross sectional views showing states where the semiconductor device according to Embodiment 3 is being fabricated. First, as shown in FIG. 13, n-buffer layer 11 is epitaxially grown on the n$^+$ semiconductor substrate which has, for example, about 300 μm thick and which will serve as the n$^+$ drain layer 1. Next, as shown in FIG. 14, screen oxide film 71 which has, for example, 250 Å thick is formed on n-buffer layer 11. Next, resist mask 72 having an opening portion corresponding to a region where p-buffer layer 61 will be formed is formed on screen oxide film 71.

Figure 15:
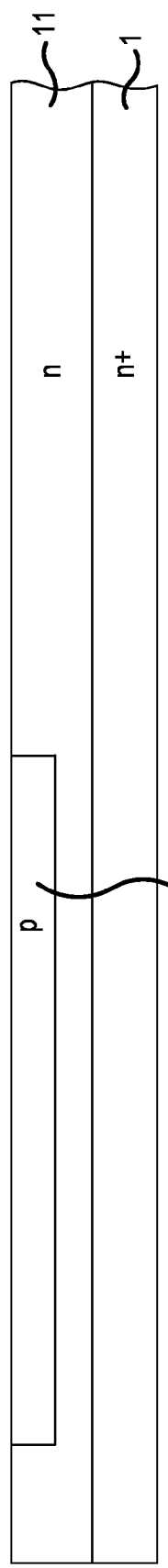
FIG. 15 is a cross sectional view showing a state in which the semiconductor device according to Embodiment 3 is being fabricated.

Next, from above the screen oxide film 71, p-type impurities such as boron are ion-injected into n-buffer layer 11 exposed in the opening portion of resist mask 72. Thus, p-type impurity layer 73 which will serve as p-buffer layer 61 is formed selectively in a surface layer of n-buffer layer 11. Next, as shown in FIG. 15, after resist mask 72 is removed, p-type impurity layer 73 is activated by heat treatment so that p-buffer layer 61 is formed inside n-buffer layer 11. The thermal budget for forming p-buffer layer 61 may be performed simultaneously with thermal budget for activating first and second parallel pn structures formed by a subsequent multi epitaxial process. Next, screen oxide film 71 is removed.

Figure 16:
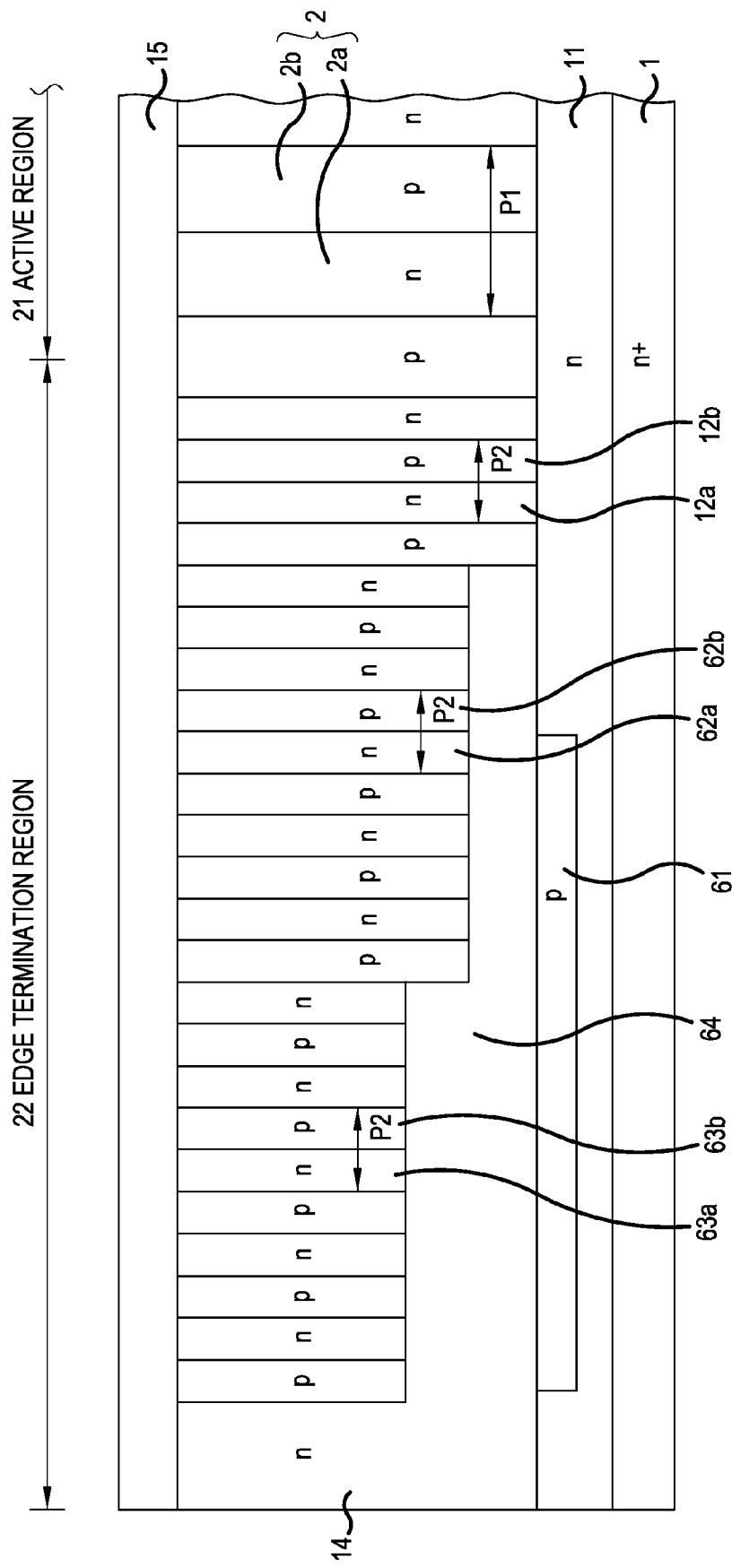
FIG. 16 is a cross sectional view showing a state in which the semiconductor device according to Embodiment 3 is being fabricated.

Next, as shown in FIG. 16, first to fourth parallel pn structures, n-type region 64, and n-type channel stopper region 14 are formed on n-buffer layer 11 by a general multi epitaxial growth method in the same manner as in Embodiment 1. In the multi epitaxial process, patterning may be performed so that portions where p-type regions should not be formed (that is, portions which will serve as first to fourth n-type regions 2a, 12a, 62a and 63a and n-type region 64 and n-type channel stopper region 14) can be covered with a resist mask. Then, an MOS gate structure and a front side electrode and a back side electrode in active region 21 are formed by a general method. Thus, a superjunction MOSFET shown in FIG. 12 is completed.

As described above, according to Embodiment 3, a similar effect to that of Embodiment 1 can be obtained.

Embodiment 4

Figure 17:
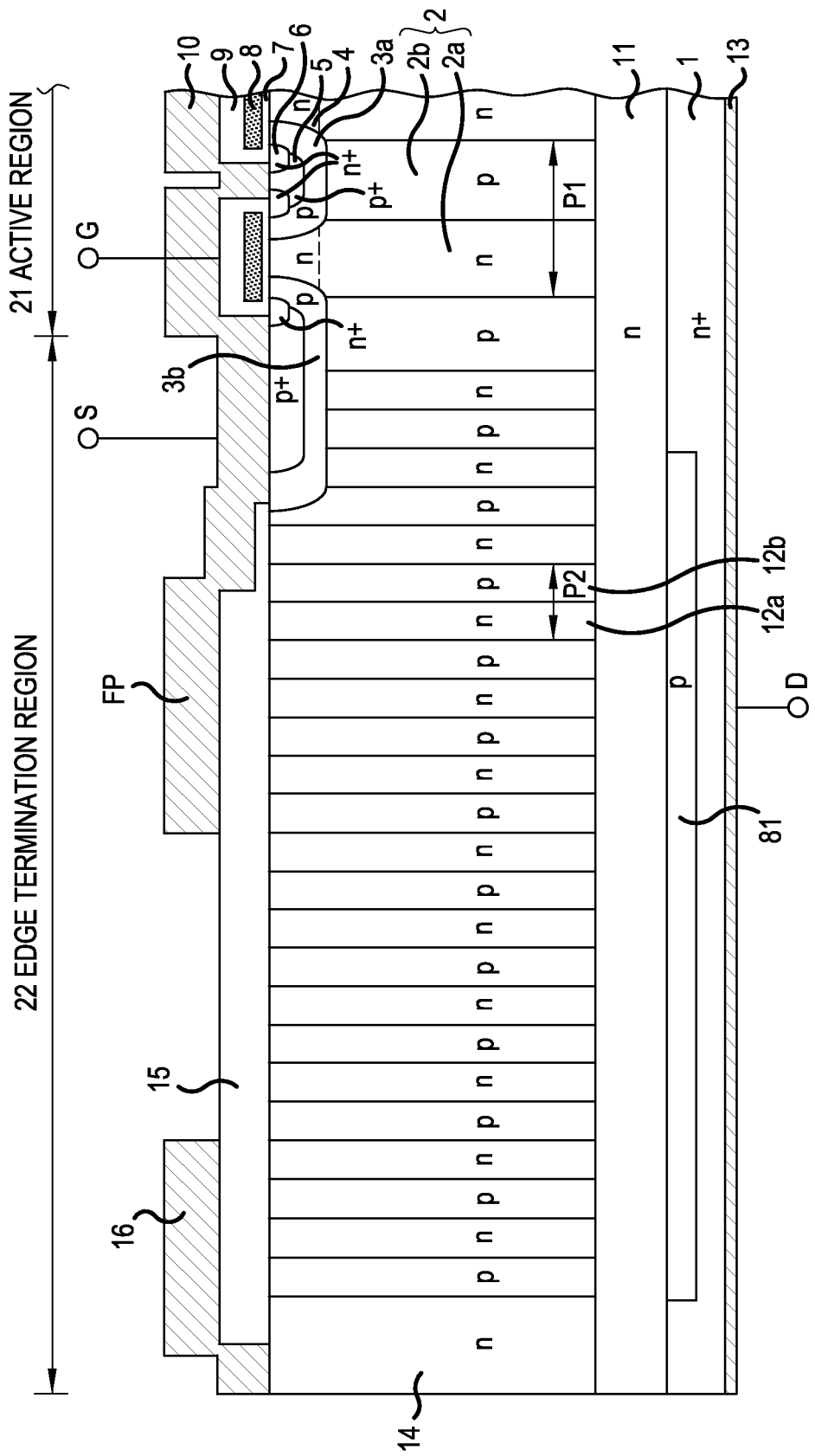
FIG. 17 is a cross sectional view of a semiconductor device according to Embodiment 4.

The structure of a superjunction semiconductor device according to Embodiment 4 will be described. FIG. 17 is a cross sectional view of the semiconductor device according to Embodiment 4. The superjunction semiconductor device according to Embodiment 4 is different from the superjunction semiconductor device according to Embodiment 1 in the point that p-buffer layer 81 is provided inside n⁺ drain layer 1 so as to come into contact with n-buffer layer 11 or provided in an interface between n⁺ drain layer 1 and n-buffer layer 11. That is, p-buffer layer 81 is separated from the second parallel pn structure by n-buffer layer 11. The case where p-buffer layer 81 is provided inside n⁺ drain layer 1 is shown in FIG. 17. The configuration of the superjunction semiconductor device according to Embodiment 4 except the different point is the same as that of the superjunction semiconductor device according to Embodiment 1.

Next, a method for manufacturing the superjunction semiconductor device according to Embodiment 4 will be described. First, a screen oxide film (not shown) is formed on the n⁺ semiconductor substrate which has, for example, about 300 μm thick and which will serve as n⁺ drain layer 1. Next, a resist mask (not shown) having an opening portion corresponding to a region where p-buffer layer 81 will be formed is formed on the screen oxide film. From above the screen oxide film, p-type impurities such as boron are ion-injected into n⁺ drain layer 1 exposed in the opening portion of the resist mask. Thus, a p-type impurity layer (not shown) which will serve as p-buffer layer 81 is formed selectively in a surface layer of n⁺ drain layer 1.

Next, the p-type impurity layer inside n⁺ drain layer 1 is activated by thermal budget so that p-buffer layer 81 is formed in the surface layer of the n⁺ drain layer 1. The thermal budget for forming p-buffer layer 81 may be performed simultaneously with thermal budget for activating first and second parallel pn structures formed by a subsequent multi epitaxial process. The resist mask and the screen oxide film are removed, and then n-buffer layer 11 is epitaxially grown on n⁺ drain layer 1 so as to cover p-buffer layer 81. Then, the steps for the multi epitaxial process and the steps after the multi epitaxial process are performed sequentially in the same manner as in Embodiment 1. Thus, a superjunction MOSFET shown in FIG. 17 is completed.

As described above, according to Embodiment 4, a similar effect to that in Embodiment 1 can be obtained.

In the above description, according to the invention, for example, in the case of a vertical MOSFET, the active region formed on the first main surface side of the substrate serves as a switching portion including a channel diffusion layer forming an inversion layer on the first main surface side and a source region. The active region designates an active or passive portion having a selection function between conduction and non-conduction on the first main surface side of a drift portion. Therefore, the invention is not limited to the MOSFET but may be applied to an FWD, a Schottky diode, or the like. In addition, although the first conductivity-type is set as n-type and the second conductivity-type is set as p-type in each of the embodiments, the invention is also established when the first conductivity-type is set as p-type and the second conductivity-type is set as n-type.

As described above, the semiconductor device according to the invention is useful for a high power semiconductor device. Particularly, the semiconductor device according to the invention is useful for a power semiconductor device capable of increasing the breakdown voltage and the current capacity compatible, such as an MOSFT having a parallel pn structure in a drift portion.

Thus, a semiconductor device has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A semiconductor device comprising:
   an active region which is disposed on a first main surface side of a substrate to apply a current actively or passively;
   a first conductivity-type low-resistivity layer which is disposed on a second main surface side of the substrate;
   a vertical drift portion which is disposed between the active region and the low-resistivity layer so that a drift current flows into the vertical drift portion vertically in the ON state while the vertical drift portion is depleted in the OFF state, and which forms a first parallel pn structure in which a first vertical first conductivity-type region oriented in a thickness direction of the substrate and a first vertical second conductivity-type region oriented in the thickness direction of the substrate alternate repeatedly;
   an edge termination region which is provided around the vertical drift portion and disposed between the first main surface and the low-resistivity layer, so that the edge termination region substantially serves as a region in which current does not flow in the ON state while the edge termination region is depleted in the OFF state;
   a first conductivity-type layer which is provided between the first parallel pn structure and the low-resistivity layer so as to extend from the active region to the edge termination region and which has higher resistivity than the low-resistivity layer; and
   a second conductivity-type layer which is provided selectively inside the first conductivity-type layer in the edge termination region.

2. A semiconductor device according to claim 1, wherein the second conductivity-type layer is provided to extend from an interface between the active region and the edge termination region to an outer periphery of the edge termination region.

3. A semiconductor device according to claim 1, wherein the edge termination region forms a second parallel pn structure in which a second vertical first conductivity-type region oriented in the thickness direction of the substrate and a second vertical second conductivity-type region oriented in the thickness direction of the substrate are joined to each other alternately and repeatedly, and the second conductivity-type layer is disposed at a distance from the second parallel pn structure.

4. A semiconductor device according to claim 3, wherein a depth of the second parallel pn structure from the first main surface is shallower than a depth of the first parallel pn structure from the first main surface, and the second conductivity-type layer is separated from the second parallel pn structure by a first conductivity-type region provided between the second parallel pn structure and the first conductivity-type layer.

5. A semiconductor device according to claim 2, wherein the edge termination region forms a second parallel pn structure in which a second vertical first conductivity-type region oriented in the thickness direction of the substrate and a second vertical second conductivity-type region oriented in the thickness direction of the substrate are joined to each other alternately and repeatedly, and the second conductivity-type layer is disposed at a distance from the second parallel pn structure.

6. A semiconductor device according to claim 5, wherein a depth of the second parallel pn structure from the first main surface is shallower than a depth of the first parallel pn structure from the first main surface, and the second conductivity-type layer is separated from the second parallel pn structure by a first conductivity-type region provided between the second parallel pn structure and the first conductivity-type layer.

* * * * *